US012517557B2

(12) United States Patent
Zhang et al.

(10) Patent No.: US 12,517,557 B2
(45) Date of Patent: Jan. 6, 2026

(54) SYNCHRONIZATION MECHANISM, ROTATING SHAFT MECHANISM, AND ELECTRONIC DEVICE

(71) Applicant: Honor Device Co., Ltd., Shenzhen (CN)

(72) Inventors: Yaolei Zhang, Shenzhen (CN); Guotong Zhou, Shenzhen (CN); Bin Yan, Shenzhen (CN); Wenlong Huo, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 211 days.

(21) Appl. No.: 18/264,665

(22) PCT Filed: Jan. 6, 2023

(86) PCT No.: PCT/CN2023/070877
§ 371 (c)(1),
(2) Date: Aug. 8, 2023

(87) PCT Pub. No.: WO2023/138402
PCT Pub. Date: Jul. 27, 2023

(65) Prior Publication Data

US 2024/0302871 A1 Sep. 12, 2024

(30) Foreign Application Priority Data

Jan. 18, 2022 (CN) ......................... 202210055266.0
Apr. 8, 2022 (CN) ......................... 202210368061.8

(51) Int. Cl.
*G06F 1/16* (2006.01)
*F16C 11/04* (2006.01)
(Continued)

(52) U.S. Cl.
CPC ............ *G06F 1/1681* (2013.01); *F16C 11/04* (2013.01); *F16H 25/12* (2013.01); *G06F 1/1624* (2013.01);
(Continued)

(58) Field of Classification Search
CPC .... G06F 1/1681; G06F 1/1624; G06F 1/1652; F16C 11/04; F16H 25/12; G09F 9/301;
(Continued)

(56) References Cited

U.S. PATENT DOCUMENTS 7,765,644 B2 * 8/2010 Ueyama ................ H04M 1/022 16/354
8,082,628 B2 * 12/2011 Chiang ................ G06F 1/1681 16/361
(Continued)

FOREIGN PATENT DOCUMENTS

CN 203214573 U 9/2013
CN 203585063 U 5/2014
(Continued)

*Primary Examiner* — Allen L Parker
*Assistant Examiner* — Martin Antonio Asmat Uceda
(74) *Attorney, Agent, or Firm* — Slater Matsil, LLP

(57) ABSTRACT

Embodiments of this application provide a synchronization mechanism, a rotating shaft mechanism, and an electronic device. The synchronization mechanism includes a swing arm and a slider, the swing arm rotates around an axis, the slider is slidably disposed in a direction parallel to the axis, a spiral groove is disposed on the swing arm, and a protruding part that fits the spiral groove is disposed on the slider.

16 Claims, 11 Drawing Sheets

(51) Int. Cl.

| | |
|---|---|
| ***F16H 25/12*** | (2006.01) |
| ***G09F 9/30*** | (2006.01) |
| ***H04M 1/02*** | (2006.01) |
| ***H05K 5/02*** | (2006.01) |

(52) U.S. Cl.
CPC ............ *G06F 1/1652* (2013.01); *G09F 9/301* (2013.01); *H04M 1/022* (2013.01); *H05K 5/0226* (2013.01); *H04M 1/0268* (2013.01)

(58) Field of Classification Search
CPC .. H04M 1/022; H04M 1/0268; H05K 5/0226; E05D 3/06; Y10T 403/71
See application file for complete search history.

(56) References Cited

U.S. PATENT DOCUMENTS

| | | | | |
|---|---|---|---|---|
| 8,104,144 | B2 * | 1/2012 | Wang | G06F 1/1681 16/354 |
| 8,931,141 | B2 * | 1/2015 | Chen | G06F 1/1681 16/366 |
| 8,978,209 | B1 * | 3/2015 | Lin | E05D 3/06 16/337 |
| 9,057,215 | B1 * | 6/2015 | Horng | E05D 5/10 |
| 9,185,815 | B2 * | 11/2015 | Hsu | F16H 37/065 |
| 9,265,166 | B2 * | 2/2016 | Hsu | F16H 57/021 |
| 9,274,566 | B1 * | 3/2016 | Horng | G06F 1/1681 |
| 9,388,614 | B2 * | 7/2016 | Hsu | E05D 3/12 |
| 9,898,050 | B2 * | 2/2018 | Xu | G06F 1/1681 |
| 10,257,331 | B2 | 4/2019 | Lin et al. | |
| 10,447,829 | B2 * | 10/2019 | Lin | H04M 1/021 |
| 10,474,203 | B2 * | 11/2019 | Tazbaz | G06F 1/1681 |
| 10,520,989 | B1 * | 12/2019 | Hsu | G06F 1/1652 |
| 10,590,685 | B2 * | 3/2020 | Hsu | G06F 1/1652 |
| 10,824,204 | B2 | 11/2020 | Lin et al. | |
| 10,963,020 | B2 * | 3/2021 | Kim | H04M 1/022 |
| 10,976,774 | B2 * | 4/2021 | Sun | H05K 1/028 |
| 11,008,789 | B2 * | 5/2021 | Hatano | E05D 3/12 |
| 11,337,321 | B2 * | 5/2022 | Jia | H04M 1/02 |
| 11,630,491 | B2 * | 4/2023 | Huang | G06F 1/1616 361/679.01 |
| 11,927,991 | B2 * | 3/2024 | Torres | E05D 3/16 |
| 12,085,123 | B2 * | 9/2024 | Yang | G06F 1/1616 |
| 12,282,363 | B2 * | 4/2025 | Torres | E05D 3/06 |
| 2015/0040704 | A1 | 2/2015 | Hsu | |
| 2015/0052707 | A1 | 2/2015 | Lin | |
| 2015/0160695 | A1 * | 6/2015 | Su | E05D 3/12 16/366 |
| 2018/0329462 | A1 * | 11/2018 | Larsen | G06F 1/1681 |
| 2021/0208641 | A1 | 7/2021 | Huang et al. | |
| 2022/0116489 | A1 | 4/2022 | Nagai et al. | |
| 2023/0213056 | A1 * | 7/2023 | Han | G06F 1/1656 455/575.3 |
| 2023/0353665 | A1 * | 11/2023 | Han | G06F 1/1652 |
| 2024/0004430 | A1 | 1/2024 | Zhao et al. | |
| 2024/0007554 | A1 * | 1/2024 | Cheng | H04M 1/0269 |

FOREIGN PATENT DOCUMENTS

| | | | |
|---|---|---|---|
| CN | 203614585 | U | 5/2014 |
| CN | 206918043 | U | 1/2018 |
| CN | 110336898 | A | 10/2019 |
| CN | 111885236 | A | 11/2020 |
| CN | 112153178 | A | 12/2020 |
| CN | 113067923 | A | 7/2021 |
| CN | 113067924 | A | 7/2021 |
| CN | 113067925 | A | 7/2021 |
| CN | 113404767 | A | 9/2021 |
| CN | 113873059 | A | 12/2021 |
| CN | 113890910 | A | 1/2022 |
| CN | 115325019 | A | 11/2022 |
| JP | 2015158216 | A | 9/2015 |
| JP | 6397195 | B2 | 9/2018 |
| JP | 2020067907 | A | 4/2020 |
| KR | 102284053 | B1 | 8/2021 |

* cited by examiner

SYNCHRONIZATION MECHANISM, ROTATING SHAFT MECHANISM, AND ELECTRONIC DEVICE

CROSS-REFERENCE TO RELATED APPLICATIONS

This application is a national stage of International Application No. PCT/CN2023/070877, filed on Jan. 6, 2023, which claims priority to Chinese Patent Application No. 202210055266.0, filed on Jan. 18, 2022, and priority to Chinese Patent Application No. 202210368061.8, filed on Apr. 8, 2022. The disclosures of each of the aforementioned applications are hereby incorporated by reference in their entireties.

TECHNICAL FIELD

This application relates to the field of electronic products, and in particular, to a synchronization mechanism, a rotating shaft mechanism, and an electronic device.

BACKGROUND

When being folded or unfolded, a foldable screen rotates around a rotating shaft mechanism. A first swing arm and a second swing arm are disposed on the rotating shaft mechanism, the two swing arms are connected to a middle frame, and a synchronization mechanism is provided. The synchronization mechanism includes a gear set including four successively meshed gears, and the swing arms on both sides are connected to the gear set, to implement synchronous swing. However, to ensure strength of meshing teeth, in the synchronization mechanism, a size of the gear cannot be significantly reduced. In addition, there are a large quantity of parts, costs are high, and assembly is difficult. A requirement for synchronous rotation of left and right middle frames can be met only when the four gears are successively arranged. When four pinion gears are assembled and meshed based on positions, a procedure is complex, a high requirement is imposed, and it is difficult to reduce costs.

SUMMARY

According to a first aspect, an embodiment of this application provides a synchronization mechanism including a base, a slider, and a first swing arm and a second swing arm that are located on both sides of the slider. Both the first swing arm and the second swing arm rotate relative to the base.

The slider is slidably disposed in a direction parallel to an axial direction of rotation of the first swing arm and the second swing arm; first fitting parts are symmetrically disposed on both the first swing arm and the second swing arm along a center line of the base, second fitting parts are symmetrically on both sides of the slider along the center line, and the second fitting parts correspond to the first fitting parts; and when the first swing arm and the second swing arm rotate relative to each other, the first fitting parts and the second fitting parts fit to drive the slider to slide in the axial direction, so that rotation angles of the first swing arm and the second swing arm relative to the base keep consistent.

The slider is disposed in the synchronization mechanism in this embodiment of this application, and the swing arms on both sides are driven, through fitting of the first fitting parts and the second fitting parts, to perform synchronous actions; in other words, the slider fits a corresponding rotary swing arm mechanism. In this way, a size of a synchronization mechanism with a requirement for a small size of an electronic device such as a foldable screen is further reduced, a quantity of parts is reduced, synchronous transmission is stable, and a clearance is small.

Based on the first aspect, this embodiment of this application further provides a first implementation of the first aspect.

The synchronization mechanism further includes a first rotating shaft and a second rotating shaft that are mounted on the base, the first swing arm rotates around the first rotating shaft, the second swing arm rotates around the second rotating shaft, and the slider slides along the first rotating shaft and the second rotating shaft. If the slider slides along the rotating shafts of the first swing arm and the second swing arm, another sliding constraint member does not need to be added to the slider, so that the quantity of parts is further reduced, a tolerance chain is also reduced, and the clearance can be reduced.

Based on the first implementation of the first aspect, this embodiment of this application further provides a second implementation of the first aspect.

First sleeves are disposed on both sides of the slider, the first sleeves on both sides are respectively sleeved on the first rotating shaft and the second rotating shaft, and the slider slides along the first rotating shaft and the second rotating shaft. A sliding constraint is formed by using the sleeves, a structure is simple, and slide fit is reliable and stable.

Based on the first implementation of the first aspect, this embodiment of this application further provides a third implementation of the first aspect.

Center positions of the second fitting parts on both sides of the slider in a thickness direction are at a same height as axes of the first rotating shaft and the second rotating shaft. In this way, when the first swing arm or the second swing arm rotates positively and negatively, force applied to the slider is symmetrical and even, so that a risk of jamming of the slider can be reduced, and hand feeling force can be basically symmetrical during positive and negative rotation, to improve user experience.

Based on the first implementation of the first aspect, this embodiment of this application further provides a fourth implementation of the first aspect.

The slider has four corner regions, the first sleeve is disposed in each of the four corner regions, and the second fitting part is disposed between two first sleeves on each side. In this way, a distance in an X\Y direction between sliding constraints is as far as possible, to reduce rotation that occurs in conduction synchronous motion when the slider slides in a Y direction, thereby reducing risks of jamming and out-of-synchronization of the first swing arm and the second swing arm.

Based on the fourth implementation of the first aspect, this embodiment of this application further provides a fifth implementation of the first aspect.

Second sleeves are disposed at both ends of each of the first swing arm and the second swing arm, a protrusion is disposed at a middle part in the axial direction, the first fitting part is disposed on the protrusion, the first rotating shaft and the second rotating shaft respectively pass through the two corresponding second sleeves and the protrusion, and the first sleeve slides between the second sleeve and the protrusion. Accommodating space is formed between the second sleeve and the protrusion, and the first sleeve slides in the accommodating space, so that the space can be fully used, and a structure can be simplified.

Based on the first aspect and any one of the first to the fifth implementations of the first aspect, this embodiment of this application further provides a sixth implementation of the first aspect.

The first fitting part is a spiral groove, and the second fitting part is a protruding part. The protruding part fits the spiral groove, so that rotation of the first swing arm and the second swing arm is more stable.

Based on the sixth implementation of the first aspect, this embodiment of this application further provides a seventh implementation of the first aspect.

At least one protruding part is disposed on each side of the slider, and each protruding part corresponds to one spiral groove, or one spiral groove corresponds to more than one protruding part. A plurality of protruding parts and a plurality of spiral grooves are disposed, or a plurality of protruding parts and one spiral groove are disposed, so that synchronous actions of spiral fitting are more reliable.

Based on the sixth implementation of the first aspect, this embodiment of this application further provides an eighth implementation of the first aspect.

A surface that is of the protruding part and that faces the spiral groove is a spiral curved surface that fits a groove bottom surface of the spiral groove. The spiral curved surface is in full contact with the spiral groove, and sliding interaction is reliable.

Based on the sixth implementation of the first aspect, this embodiment of this application further provides a ninth implementation of the first aspect.

A width of the protruding part and a width of the spiral groove are approximately equal. This not only ensures that the protruding part and the spiral groove can always interact with each other, but also does not interfere with relative motion of the protruding part and the spiral groove.

Based on any one of the first to the ninth implementations of the first aspect, this embodiment of this application further provides a tenth implementation of the first aspect.

Third sleeves are disposed at both ends on both sides of the base, and the first rotating shaft and the second rotating shaft are inserted into two third sleeves on a corresponding side. The first rotating shaft and the second rotating shaft are mounted by using a sleeve structure, and share, with the first sleeve and the second sleeve, space in which the rotating shaft is located. This facilitates a compact structure.

Based on the tenth implementation of the first aspect, this embodiment of this application further provides an eleventh implementation of the first aspect.

The slider is in slide fit with the base in the axial direction. Slide fit between the slider and the base helps further ensure stable and reliable sliding.

Based on the eleventh implementation of the first aspect, this embodiment of this application further provides a twelfth implementation of the first aspect.

The slider is disposed between the base and the rotating shaft pedestal, a groove is disposed on a bottom part of the slider, and the groove is in slide fit with the base; or a groove is disposed on the base, and a sliding platform that fits the groove is disposed on the bottom part of the slider. Slide fit is implemented by using the groove, and the fit is stable.

Based on the twelfth implementation of the first aspect, this embodiment of this application further provides a thirteenth implementation of the first aspect.

The groove is a dovetail groove, a protrusion is disposed on the base or the slider, and the protrusion is in slide fit with the dovetail groove. Sliding limit in which the dovetail groove fits the protrusion is more stable, and sliding is stable.

According to a second aspect, an embodiment of this application further provides a rotating shaft mechanism including a rotating shaft pedestal and a shaft cover, and at least one group of the foregoing synchronization mechanisms is disposed between the rotating shaft pedestal and the shaft cover. One or more groups of synchronization mechanisms may be disposed based on a length of the rotating shaft pedestal, and this helps ensure synchronization reliability.

Based on the second aspect, this embodiment of this application further provides a first implementation of the second aspect.

The base is disposed between the shaft cover and the rotating shaft pedestal of the rotating shaft mechanism. The base disposed between the shaft cover and the rotating shaft pedestal is configured to mount a first rotating shaft and a second rotating shaft. This facilitates processing and arranging, a structure is compact, and processing and manufacturing are also facilitated.

Based on the first implementation of the second aspect, this embodiment of this application further provides a second implementation of the second aspect.

The base is fixedly connected to one of the shaft cover and the rotating shaft pedestal, or the base, the shaft cover, and the rotating shaft pedestal are integrally disposed. When the base is integrally disposed with the shaft cover or the rotating shaft pedestal, a structure is simple, and assembly is easy. When the base is fixedly connected to the shaft cover or the rotating shaft pedestal, processing is facilitated.

Based on the second aspect, this embodiment of this application further provides a third implementation of the second aspect.

The rotating shaft mechanism includes a primary swing arm and a secondary swing arm, the secondary swing arm is slidably connected to the primary swing arm, and the first swing arm and the second swing arm are primary swing arms or secondary swing arms. The first swing arm and the second swing arm may be set to primary swing arms or secondary swing arms based on a layout.

According to a third aspect, an embodiment of this application further provides an electronic device including a flexible foldable screen, a middle frame supporting the flexible foldable screen, and the rotating shaft mechanism provided in the second aspect and any implementation of the second aspect. The electronic device has same technical effects as the foregoing rotating shaft mechanism.

Based on the third aspect, this embodiment of this application further provides a first implementation of the third aspect.

The first swing arm or the second swing arm is fastened to the middle frame.

DETAILED DESCRIPTION OF ILLUSTRATIVE EMBODIMENTS

Figure 1:
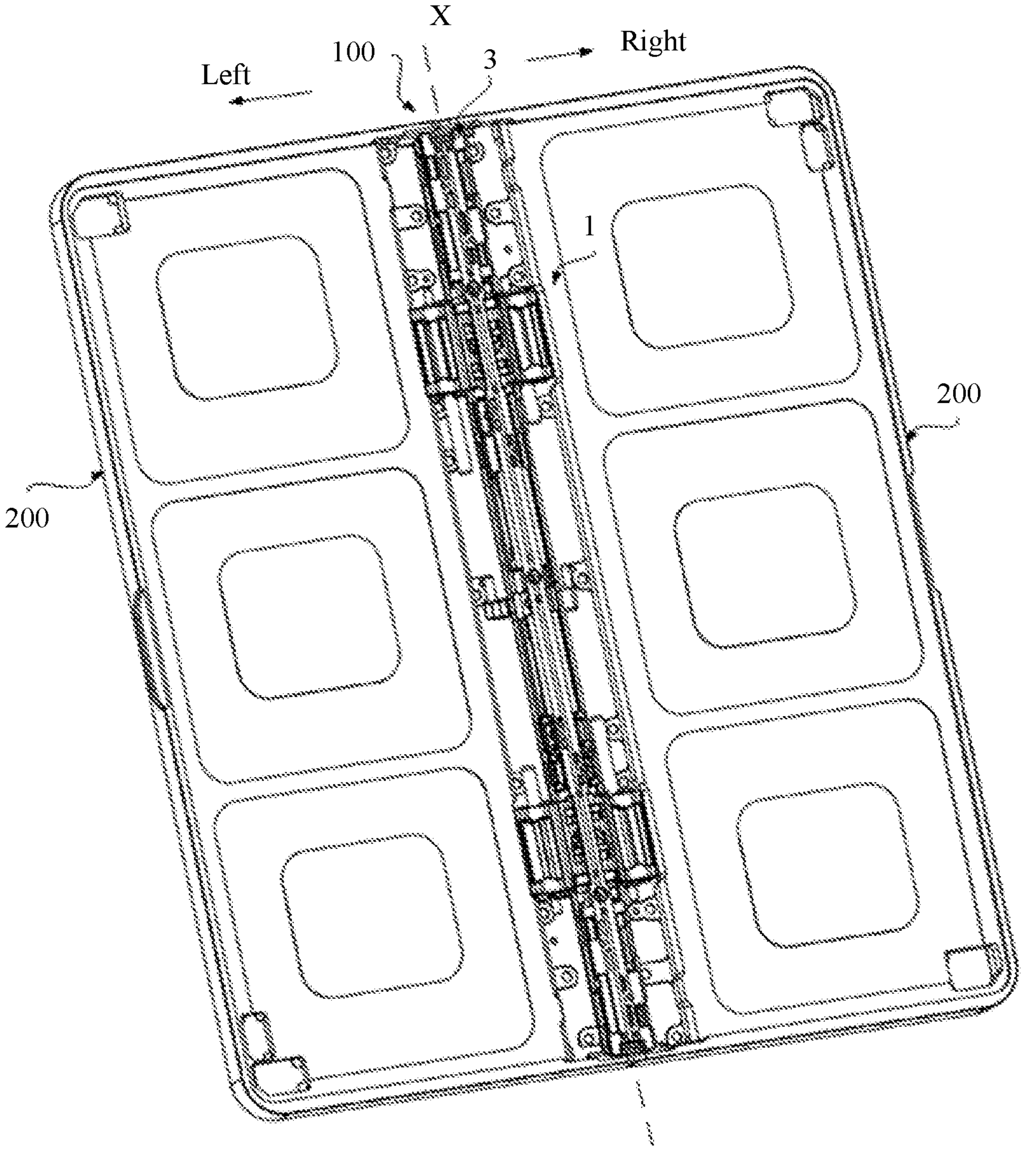
FIG. 1 is a schematic diagram of an unfolded electronic device according to an embodiment of this application, where a flexible display screen is not shown.
Figure 15:
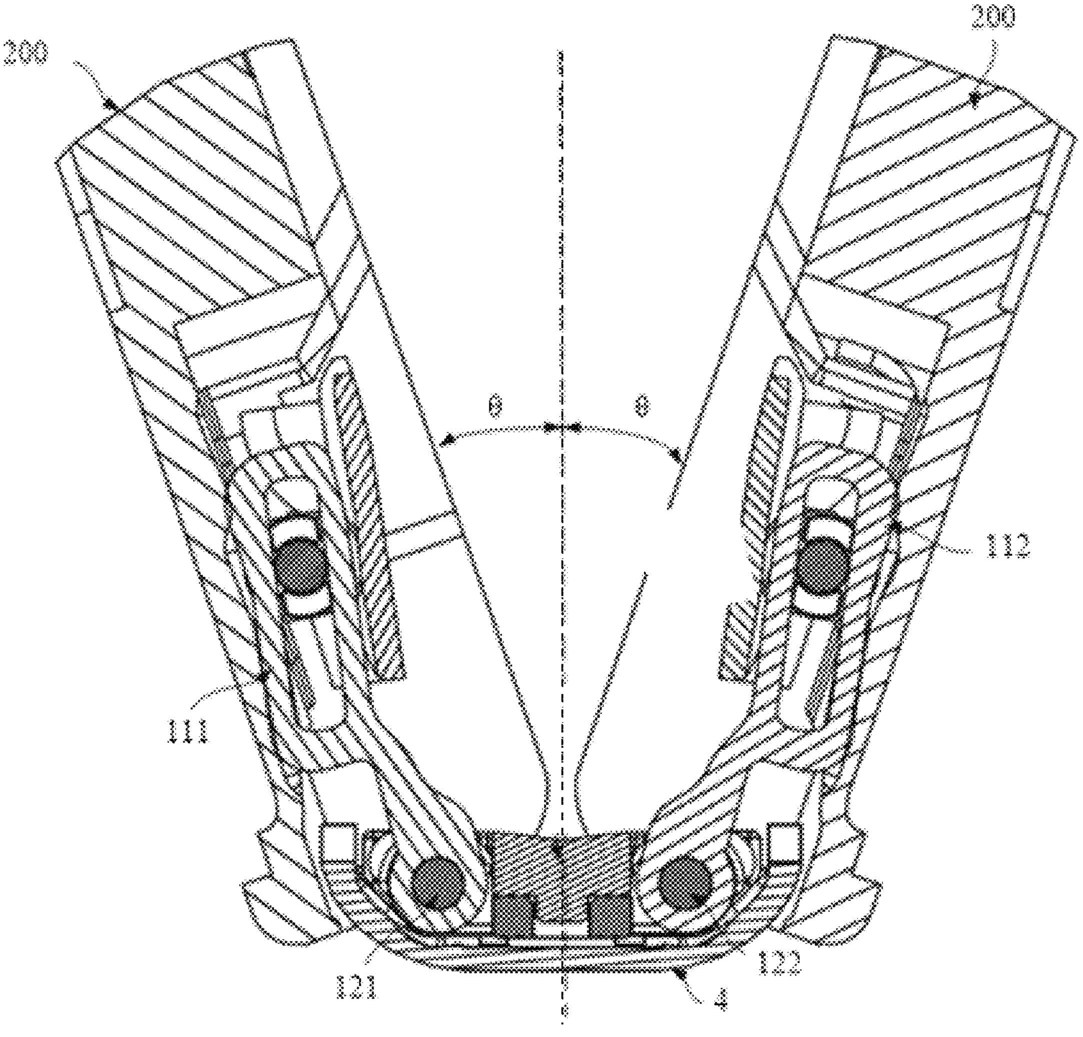
FIG. 15 is a schematic diagram of a mobile phone in FIG. 1 in a folded state.

Embodiments of this application provide an electronic device. For example, the electronic device is a mobile phone. The electronic device includes a flexible foldable screen (also referred to as a "flexible display screen") and a rotating shaft mechanism 100. The flexible foldable screen is rotatably folded or unfolded by using the rotating shaft mechanism 100. As shown in FIG. 1 and FIG. 15, FIG. 1 is a schematic diagram of a mobile phone in an unfolded state according to an embodiment of this application, where the rotating shaft mechanism 100 and a middle frame 200 are shown, and the flexible foldable screen is not shown; and FIG. 15 is a schematic diagram of the mobile phone in FIG. 1 in a folded state.

The mobile phone includes the rotating shaft mechanism 100 located in the middle and middle frames 200 located on both sides of the rotating shaft mechanism 100. The flexible foldable screen is supported on the middle frames 200 on both sides. The rotating shaft mechanism 100 includes a rotating shaft pedestal 3 (also referred to as an "integral rotating shaft base"). In this embodiment, a central axis X of the rotating shaft mechanism 100 is used as a reference to define left and right. The middle frames 200 on left and right sides of the rotating shaft mechanism 100 may rotate relative to the rotating shaft pedestal 3, to drive the flexible foldable screen to be folded or unfolded. Specifically, a swing arm may be disposed. One side of the swing arm is rotatably connected to the rotating shaft pedestal 3, and the other side is fastened to the middle frame 200. The swing arm implements a rotary connection between the middle frame 200 and the rotating shaft pedestal 3. The rotating shaft pedestal 3 may be of an integral structure, or may be split into a plurality of parts that are fastened by using a fastening member (such as a screw or a rivet), through glue dispensing, through welding, or the like. As shown in FIG. 15, the rotating shaft mechanism 100 further includes a shaft cover 4 disposed below the rotating shaft pedestal 3, to cover a bottom part of the rotating shaft mechanism 100. A side that faces the flexible foldable screen is defined as a top part, and a side that is away from the flexible foldable screen is defined as a bottom part. The middle frame 100 rotates relative to the rotating shaft mechanism 200, the middle frame 100 is rotatably connected to the rotating shaft pedestal 3, and relative positions of the shaft cover 4 and the rotating shaft pedestal 3 remain unchanged. Therefore, the middle frame 200 also rotates relative to the shaft cover 4.

In this embodiment, the rotating shaft mechanism 100 of the mobile phone further includes a synchronization mechanism 1. The synchronization mechanism 1 is configured to keep rotation angles θ of the middle frames 200 on both sides of the rotating shaft mechanism 100 relative to the shaft cover 4 or the rotating shaft pedestal 3 consistent in a folding and unfolding process of the rotating shaft mechanism 100. The rotation angle θ may be understood with reference to FIG. 15. It may be understood that, due to a manufacturing or assembly tolerance, in a rotation process, there may be a specific angle deviation for the rotation angles θ of the middle frames 200 on both sides. Generally, a range of the angle deviation may be 0°~20°, and within the range of the angle deviation, it may still be considered as that the rotation angles keep consistent.

Figure 2:
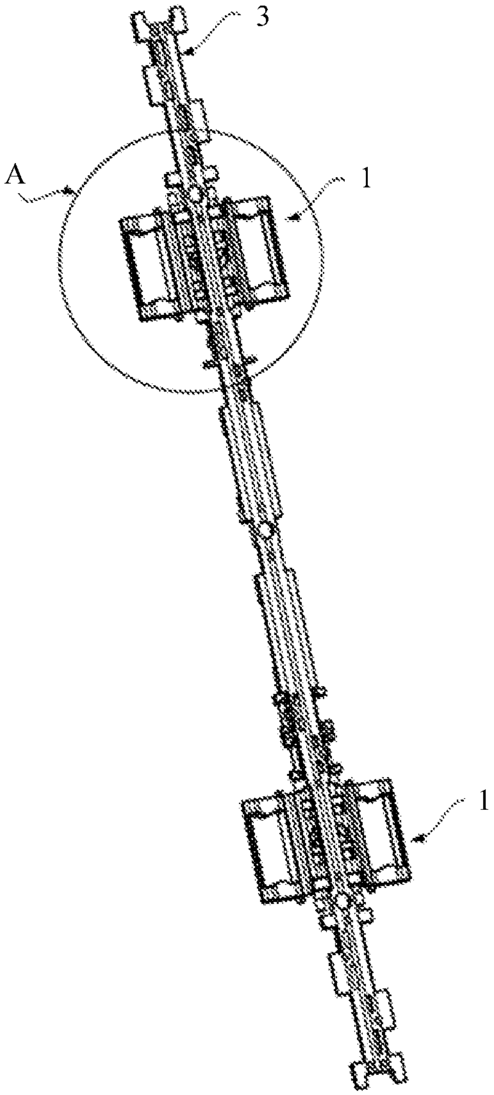
FIG. 2 is a schematic diagram of fitting between a synchronization mechanism and a rotating shaft pedestal in FIG. 1.
Figure 3:
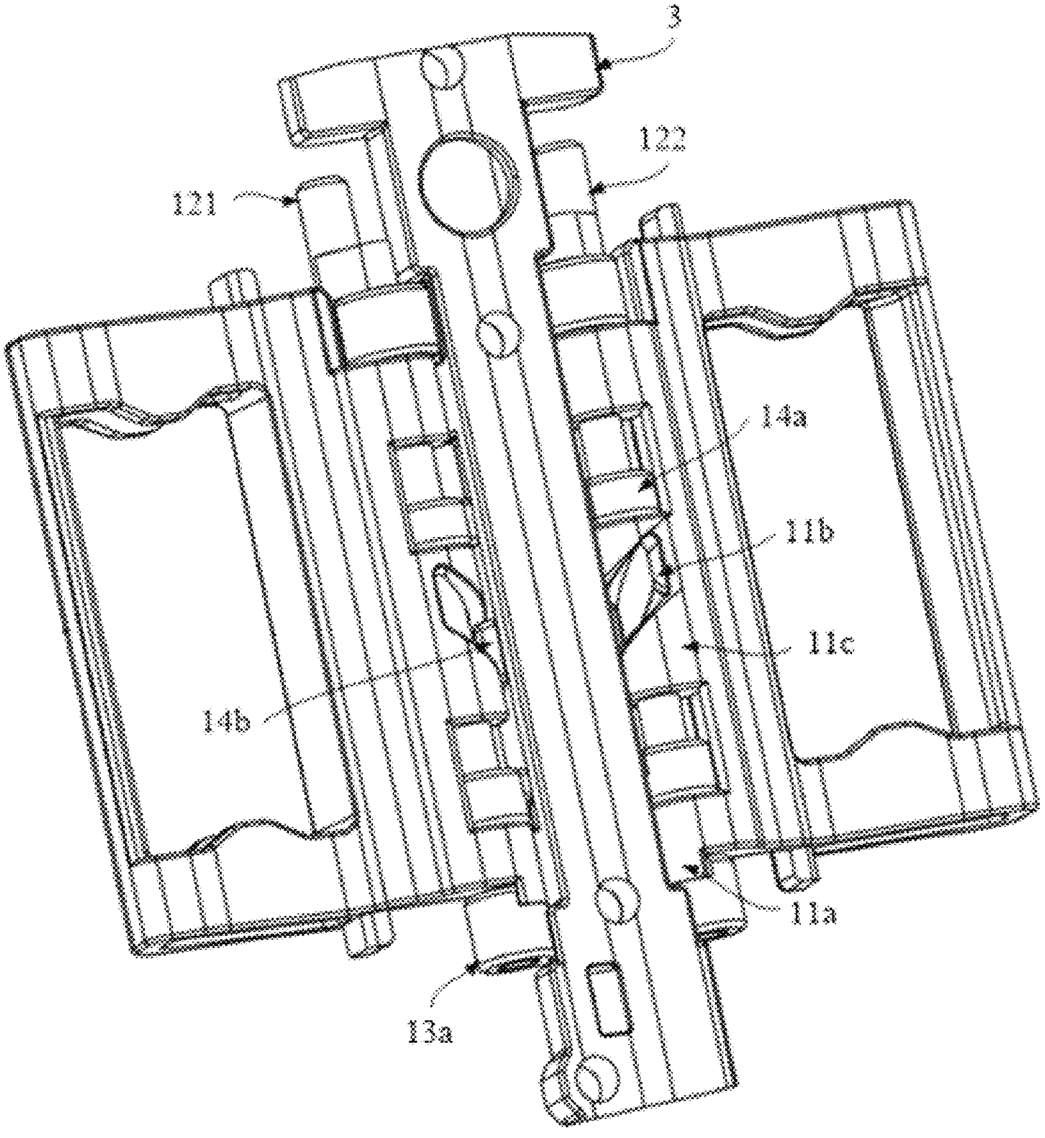
FIG. 3 is an enlarged view of a position A in FIG. 2.
Figure 4:
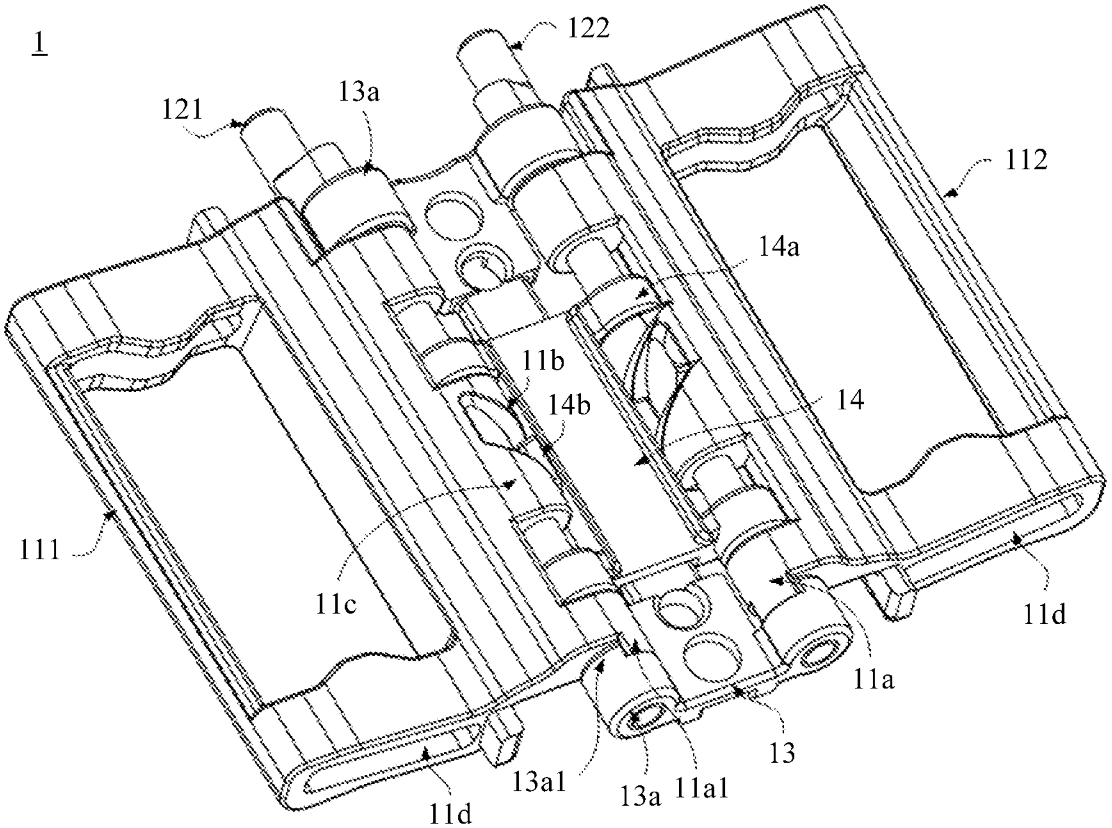
FIG. 4 is a schematic diagram of a synchronization mechanism in FIG. 3.
Figure 5:
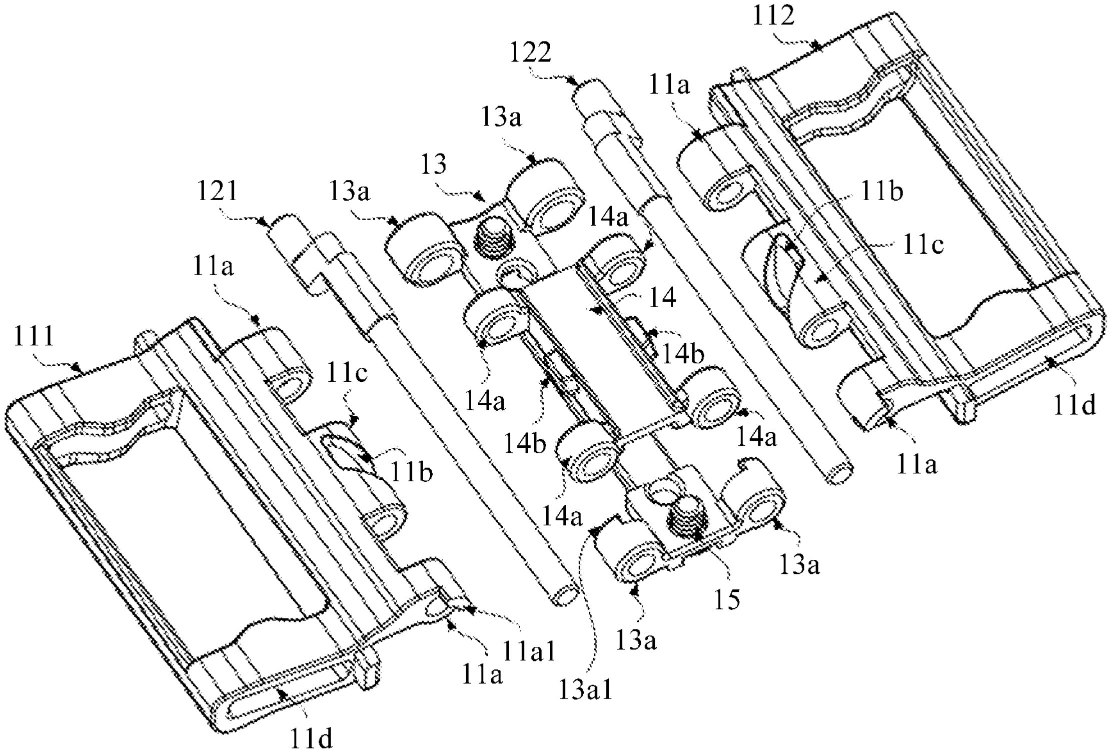
FIG. 5 is an exploded diagram of a synchronization mechanism in FIG. 4.

For the synchronization mechanism 1 in this embodiment, refer to FIG. 2-FIG. 5. FIG. 2 is a schematic diagram of fitting between the synchronization mechanism 1 and the rotating shaft pedestal 3 in FIG. 1. FIG. 3 is an enlarged view of a position A in FIG. 2. FIG. 4 is a schematic diagram of the synchronization mechanism 1 in FIG. 3. FIG. 5 is an exploded diagram of the synchronization mechanism 1 in FIG. 4.

The synchronization mechanism 1 includes a left swing arm (which is alternatively defined as a first swing arm 111), a right swing arm (which is alternatively defined as a second swing arm 112), a left rotating shaft (which is alternatively defined as a first rotating shaft 121), a right rotating shaft (which is alternatively defined as a second rotating shaft 122), a base (the base may be specifically a rotating shaft base 13 in FIG. 4), and a slider 14 (which is alternatively defined as a transmission slider, a synchronization block, or a sliding part).

The rotating shaft base 13 is used as a basis of the synchronization mechanism 1, and is configured to mount the first swing arm 111, the second swing arm 112, the first rotating shaft 121, the second rotating shaft 122, and the slider 14. The rotating shaft base 13 is disposed between the shaft cover 4 and the rotating shaft pedestal 3. The rotating shaft base 13 in this embodiment is mounted on the rotating shaft pedestal 3. FIG. 5 shows a bolt 15 used to be connected to the rotating shaft pedestal 3. The base may alternatively be fastened to the shaft cover 4. It may be understood that the base may alternatively be a part of the rotating shaft pedestal 3 or the shaft cover 4, for example, the base is integrally disposed on the rotating shaft pedestal 3 or the shaft cover 4. In FIG. 1 and FIG. 2, it may be learned that a total of two groups of synchronization mechanisms 1 arranged in a length direction of the rotating shaft mechanism 100 are disposed on the rotating shaft mechanism 100 of the mobile phone, and two rotating shaft bases 13 are correspondingly disposed, to mount parts such as the first swing arm 111, the second swing arm 112, the first rotating shaft 121, the second rotating shaft 122, and the slider 14 in each group of synchronization mechanisms 1. It may be learned that one rotating shaft base 13 may alternatively be disposed to mount parts of two or more groups of synchronization mechanisms 1.

The first rotating shaft 121 and the second rotating shaft 122 of the synchronization mechanism 1 are disposed on the rotating shaft base 13. The first rotating shaft 121 and the second rotating shaft 122 may be fixedly connected to the rotating shaft base 13, or may be rotatably connected to the rotating shaft base 13, provided that a rotation axis is consistent with rotation axes of the first swing arm 111 and the second swing arm 112. As shown in FIG. 4 and FIG. 5, the first rotating shaft 121 and the second rotating shaft 122 are constrained by using the rotating shaft base 13. Sleeves are disposed at both ends on left and right sides of the rotating shaft base 13 in a length direction, and may be defined as third sleeves 13*a*. The length direction of the rotating shaft base 13 is consistent with a length direction of the rotating shaft pedestal 3. In other words, the third sleeve 13*a* is disposed in each of four corner regions of the rotating shaft base 13. In this way, the first rotating shaft 121 and the second rotating shaft 122 may be inserted into two third sleeves 13*a* on a corresponding side of the rotating shaft base 13 in respective length directions or in respective axial directions. Continue to refer to FIG. 4. Both end parts of the first rotating shaft 121 and the second rotating shaft 122 pass through the third sleeves 13*a* on the corresponding side, and may be axially limited to the third sleeves 13*a*, that is, can rotate only relative to the third sleeves 13*a*. A specific limiting manner is, for example, that a limiting part is disposed on an end part of the rotating shaft, and the limiting part is, for example, a locking nut or a locking cover, and abuts on an end surface of the third sleeve 13*a*. In FIG. 5, one end part of each of the first rotating shaft 121 and the second rotating shaft 122 is L-shaped, and the other end part passes through the two third sleeves 13*a* on the corresponding side. The L-shaped end part may abut on an end surface of the third sleeve 13*a*, to form limiting, and a limiting part may be disposed on the other end part opposite to the L-shaped end part; or the L-shaped end part abuts on another part to form axial limiting, and a limiting part does not need to be disposed on the other end part, to facilitate an assembly operation.

As shown in FIG. 4, the first swing arm 111 and the second swing arm 112 are symmetrically arranged on left and right sides of a central axis of the rotating shaft base 13, and the central axis of the rotating shaft base 13*a* and a central axis of the rotating shaft mechanism 100 are coaxial. In addition, the first swing arm 111 may rotate around the first rotating shaft 121, and the second swing arm 112 may rotate around the second rotating shaft 122. In addition, the first swing arm 111 and the second swing arm 112 are respectively connected to the middle frames 200 on both sides. As described above, the swing arm fastened to the middle frame 200 may be disposed, to implement a rotary connection to the rotating shaft pedestal 3. In this case, the first swing arm 111 and the second swing arm 112 may be swing arms that are fixedly connected to the middle frames 200. In some embodiments, a swing arm that is rotatably connected to the rotating shaft pedestal 3 may be defined as a primary swing arm, the primary swing arm is fixedly connected to the middle frame 200, the first swing arm 111 and the second swing arm 112 are secondary swing arms that are movably connected to the middle frames 200. Specifically, the secondary swing arm is slidably connected to the primary swing arm. In FIG. 4, slot holes 11*d* are disposed on both the first swing arm 111 and the second swing arm 112, and a shaft part to be inserted into the slot hole 11*d* may be disposed on the primary swing arm. The shaft part is axially limited to the primary swing arm; in other words, the first swing arm 111 and the second swing arm 112 are indirectly connected to the middle frames 200. In a rotation process of the middle frame 200 and the primary swing arm, the first swing arm 111 and the second swing arm 112 correspondingly rotate and slide relative to the shaft part in a length direction of the slot holes 11*d*.

In this embodiment, a specific connection manner of the first swing arm 111, the second swing arm 112, and the middle frames 200 of the synchronization mechanism is not limited, provided that the first swing arm 111, the second swing arm 112, and the middle frames 200 are in a direct or indirect connection relationship. When the first swing arm 111 and the second swing arm 112 respectively rotate around the first rotating shaft 121 and the second rotating shaft 122, the middle frames 200 are correspondingly driven to rotate, or when the middle frames 200 rotate, a swing arm on a corresponding side is correspondingly driven to rotate, that is, provided that there is a rotational linkage effect.

The slider 14 is further disposed on the synchronization mechanism, and the slider 14 is slidably disposed in a direction parallel to an axial direction of rotation of the first swing arm 111 and the second swing arm 112. In this embodiment, the slider 14, the first swing arm 111, and the second swing arm 112 fit each other to implement synchronous rotation control of the middle frames 200 on both sides.

Figure 6:
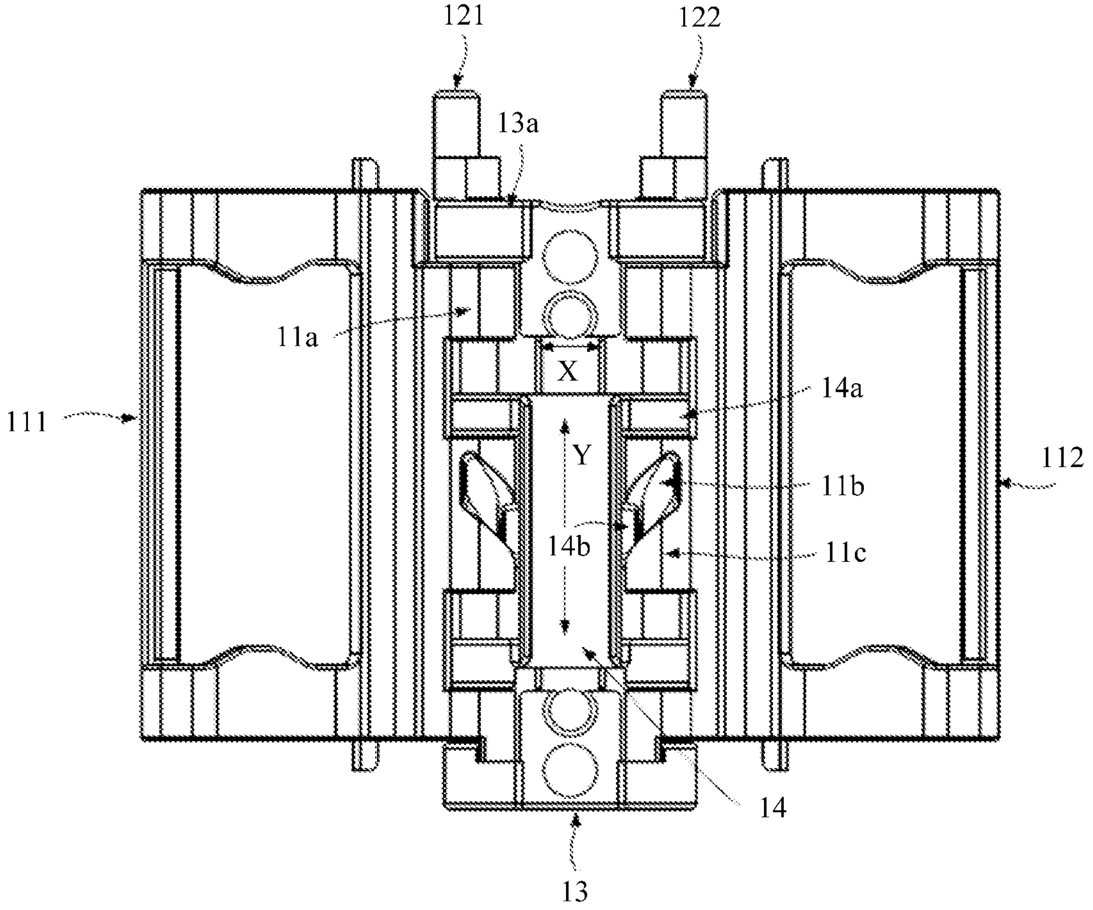
FIG. 6 is a top view of a synchronization mechanism in FIG. 4.
Figure 7:
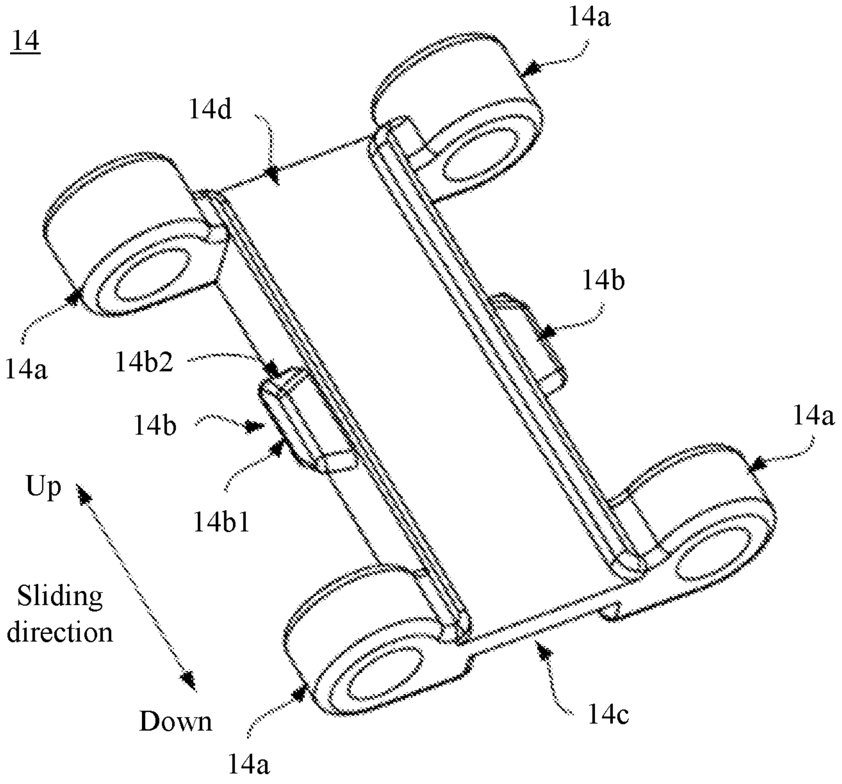
FIG. 7 is a schematic diagram of a slider in FIG. 5.
Figure 8:
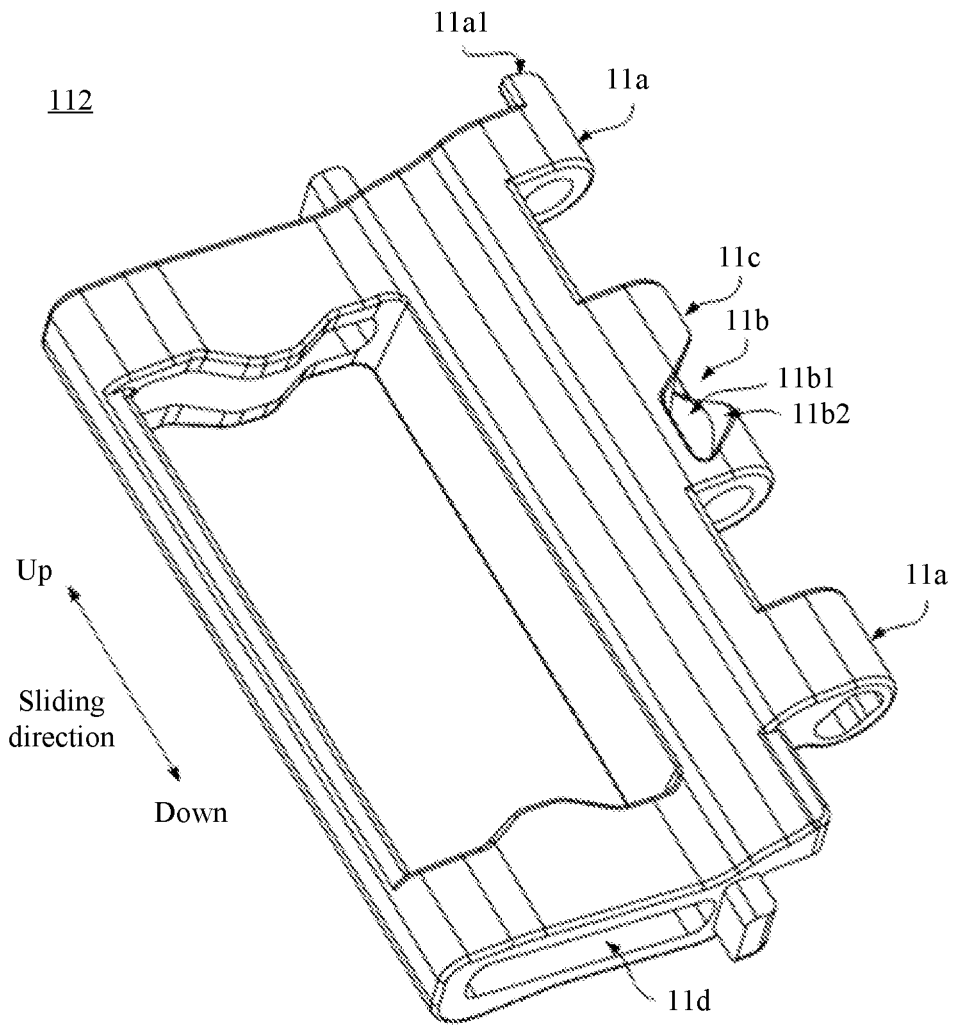
FIG. 8 is a schematic diagram of a structure of a first swing arm in FIG. 5.

Refer to FIG. 6-FIG. 8 for understanding. FIG. 6 is a top view of the synchronization mechanism in FIG. 4, where an X direction and a Y direction are shown. FIG. 7 is a schematic diagram of the slider 14 in FIG. 5. FIG. 8 is a schematic diagram of a structure of the first swing arm 111 in FIG. 5.

A sliding constraint is disposed for the slider 14 in an axial direction of a rotary connection between the first swing arm 111 and the second swing arm 112. The Y direction shown in FIG. 5 is the axial direction of the rotation of the first swing arm 111 and the second swing arm 112; in other words, the slider 14 for which the sliding constraint is disposed can slide relative to the rotating shaft base 13 only in the Y direction. Specifically, in this embodiment, as shown in FIG. 7, sleeves are disposed at both upper and lower ends on both sides of the slider 14, and may be defined as first sleeves 14*a*. The upper and lower ends are two ends in the Y direction. As shown in FIG. 4, the first rotating shaft 121 and the second rotating shaft 122 respectively pass through two first sleeves 14*a* on left and right sides of the slider 14, to form a sliding constraint. In other words, the slider 14 can freely move only in the axial directions of the first rotating shaft 121 and the second rotating shaft 122. As shown in FIG. 6, the slider 14 can move only in the Y direction.

As shown in FIG. 8, upper and lower directions marked in FIG. 8 are used for description. The upper and lower directions are also a sliding direction. Sleeves are also disposed at upper and lower ends of the first swing arm 111 and the second swing arm 112, and may be defined as second sleeves 11*a*. The first rotating shaft 121 also passes through two second sleeves 11*a* of the first swing arm 111, and the second rotating shaft 112 passes through two second sleeves 11*a* of the second swing arm 112. It may be learned that the first rotating shaft 121 sequentially passes through the third sleeve 13*a* at the upper end of the rotating shaft base 13, the second sleeve 11*a* at the upper end of the first swing arm 111, the first sleeve 14*a* at the upper end of the slider 14, the first sleeve 14*a* at the lower end of the slider 14, the second sleeve 11*a* at the lower end of the first swing arm 111, and the third sleeve 13*a* at the lower end of the rotating shaft base 13. In FIG. 8, a part of an end part of one second sleeve 11*a* extends in an axial direction to form a first limiting part 11*a*1. Alternatively, refer to FIG. 5 for understanding. A part of an end part of a third sleeve 13*a* corresponding to the rotating shaft base 13 extends in an axial direction to form a second limiting part 13*a*1. Both the first limiting part 11*a*1 and the second limiting part 13*a*1 are arcuate plates smaller than a semicircle. In this way, after the second sleeve 11*a* abuts against the third sleeve 13*a* in the axial direction, if the first swing arm 111 and the second swing arm 112 rotate relative to the rotating shaft base 13 and rotate by a specific amplitude, the first limiting part 11*a*1 and the second limiting part 13*a*1 abut against each other in a circumferential direction to form limiting, that is, are configured to limit swing amplitudes of the first swing arm 111 and the second swing arm 112, to avoid excessive rotation. As shown in FIG. 4, in a fully unfolded state, the first limiting part 11*a*1 and the second limiting part 13*a*1 are in an abutting state, and the first swing arm 111 and the second swing arm 112 cannot continue to rotate in an unfolding direction.

In addition, an inner hole of the second sleeve 11*a* may be a flat hole; in other words, a hole wall has a planar part. In FIG. 5, there is a planar part on a circumferential wall at one end of the first rotating shaft 121 and the second rotating shaft 112. After the first rotating shaft 121 is inserted into the second sleeve 11*a*, a planar part of the first rotating shaft 121 and a planar part of the second sleeve 11*a* fit each other to limit relative rotation of the first rotating shaft 121 and the second sleeve 11*a*. When the swing arm rotates, a corresponding rotating shaft is driven to rotate. It may be learned that the rotating shaft may alternatively not rotate with the second sleeve 11*a*, the second sleeve 11*a* has a circular hole, and fitting with a cylindrical section of the rotating shaft is also a feasible solution.

In this embodiment, the first sleeves 14*a* on the left and right sides of the slider 14 respectively slide along the first rotating shaft 121 and the second rotating shaft 122, and the first swing arm 111 and the second swing arm 112 also respectively rotate along the first rotating shaft 121 and the second rotating shaft 122. In other words, a sliding shaft of the slider 14 and a rotating shaft of the swing arm are concentric. The two axes share a same shaft part, that is, share the first rotating shaft 121 and the second rotating shaft 122. Therefore, there are few constraint tolerance chains, synchronization is better, and parts and space can be saved. It may be learned that the slider 14, the first swing arm 111, and the second swing arm 112 alternatively do not share the shaft part. For example, separate shaft parts are disposed on inner sides of the first rotating shaft 121 and the second rotating shaft 122 as sliding shafts of the slider 14. It should be noted that a sleeve structure (including the first sleeve 14*a*, the second sleeve 11*a*, and the third sleeve 13*a*) described herein is mainly used to limit radial movement, to perform sliding constraints in the Y direction. Therefore, the sleeve is not limited to a closed annular shape, and may alternatively have a notch, provided that sliding of the slider in the Y direction can be guided. In practice, that the slider 14 slides in the Y direction of the first rotating shaft 121 and the second rotating shaft 122 is not limited to disposing the first sleeve 14*a*. For example, chutes are disposed for the first rotating shaft 121 and the second rotating shaft 122, or sliding platforms that can slide in the chute in the Y direction are disposed on both sides of the slider 14.

Figure 9:
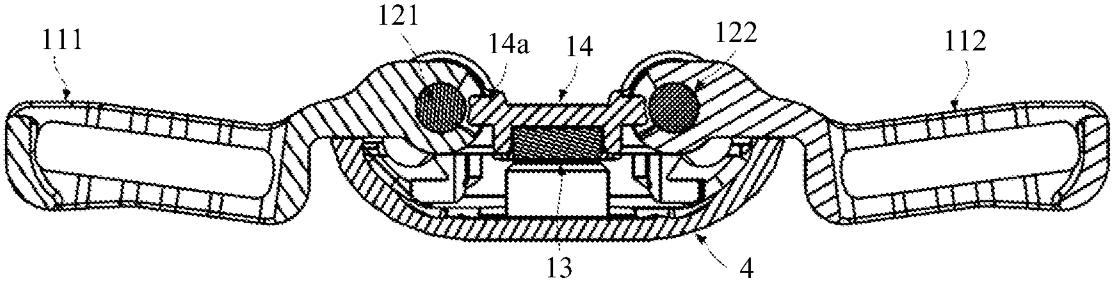
FIG. 9 is a cross-sectional view of a position of a protruding part of a synchronization mechanism in FIG. 1 in an X direction.

That the slider 14 can move relative to the rotating shaft base 13 only in the Y direction is described above. Continue to refer to FIG. 7. Second fitting parts are symmetrically disposed on both sides of the slider 14 along a center line of the rotating shaft base 13, and the second fitting parts are specifically protruding parts 14*b* (which are alternatively defined as sliding parts). In other words, a protruding part 14*b* on one side and a protruding part 14*b* on the other side are symmetrically disposed with respect to the center line of the rotating shaft base 13. The center line of the rotating shaft base 13 is parallel to the rotation axes of the first swing arm 111 and the second swing arm 112, and has an equal distance to the two rotation axes. The protruding part 14*b* may be a spiral protruding part 14*b*. A first fitting part is separately disposed on a side that is of the first swing arm 111 and the second swing arm and that faces the slider 14, and a first fitting part of the first swing arm 111 and a first fitting part of the second swing arm 112 are symmetrically disposed with respect to the center line of the rotating shaft base 13. The first fitting part is specifically a spiral groove 11*b* (which is alternatively defined as a spiral chute). The spiral groove 11*b* may be a sunk groove, or may be a through groove. As shown in FIG. 9, the spiral groove 11*b* fits a spiral protruding part 14*b*. Specifically, in FIG. 8, there are second sleeves 11*a* at both ends of the first swing arm 111, a protrusion 11*c* is disposed on a middle part, and the protrusion 11*c* is also a sleeve structure, to be penetrated by the first rotating shaft 121. Further, as shown in FIG. 4, the first rotating shaft 121 sequentially passes through the third sleeve 13*a* at the upper end of the rotating shaft base 13, the second sleeve 11*a* at the upper end of the first swing arm 111, the first sleeve 14*a* at the upper end of the slider 14, the protrusion 11*c* on the middle part of the first swing arm 111, the first sleeve 14*a* at the lower end of the slider 14, the second sleeve 11*a* at the lower end of the first swing arm 111, and the third sleeve 13*a* at the lower end of the rotating shaft base 13. For the second rotating shaft 122, refer to this for understanding. This structure significantly saves space and is compact.

The spiral groove 11*b* is disposed on protrusions 11*c* of the first swing arm 111 and the second swing arm 112. Accommodating space is formed between the protrusions 11*c* and the second sleeves 11*a* at both ends. First sleeves 14*a* at both ends on a left side of the slider 14 are located in accommodating space corresponding to both ends of the first swing arm 111, and a length of the first sleeve 14*a* of the slider 14 in the Y direction is less than a length of the accommodating space in the Y direction. In this way, the slider 14 may be allowed to move in the Y direction. The first swing arm 111 and the second swing arm 112 are symmetrically arranged. For a fitting manner between the second swing arm 112 and a right side of the slider 14, refer to a fitting manner between the first swing arm 111 and the left side of the slider 14.

Refer to FIG. 5 and FIG. 6 for understanding. A protruding part 14*b* on the left side of the slider 14 is inserted into the spiral groove 11*b* of the first swing arm 111, and a protruding part 14*b* on the right side of the slider 14 is inserted into the spiral groove 11*b* of the second swing arm 112. When the first swing arm 111 and the second swing arm 112 rotate around respective rotation axes, the spiral grooves 11*b* rotate accordingly, to correspondingly act on the spiral protruding parts 14*b* to drive the slider 14 to move in the Y direction. When the slider 14 moves, an action is reversely applied to the spiral groove 11*b* to drive the first swing arm 111 or the second swing arm 112 on a corresponding side to rotate. In this way, synchronous swing of the first swing arm 111 and the second swing arm 112 on both sides is ensured, and synchronous swing of the middle frames 200 on both sides is also ensured, so that rotation angles of the middle frames 200 on both sides keep consistent. In this solution, the slider and a rotary swing arm mechanism are set to be in slide fit with each other by using the protruding part and the spiral groove, to implement a synchronization function. In comparison with a synchronization structure of a gear set, a size of a synchronization mechanism with a requirement for a small size of an electronic device such as a foldable screen can be further reduced, and a quantity of parts is reduced, and there are advantages of stable synchronous transmission and a small clearance.

It should be noted that, in this embodiment, in a rotation process of the first swing arm 111 and the second swing arm 112, the protruding part 14*b* may always abut against and fit groove side walls 11*b*2 on both sides of the spiral grooves 11*b* in the axial direction, to form a linkage effect with sliding of the slider 14 and rotation of the swing arm. It may be learned that, according to this principle, the first fitting part is not limited to the spiral groove, provided that a side wall of the groove may abut against and fit the protruding part 14*b* in the axial direction in the rotation process, and the groove may be a straight groove or a curved groove. Certainly, when the spiral groove 11*b* fits the protruding part 14*b*, it can be ensured that both the slider 14 and the swing arm can perform actions more stably.

In this embodiment of this application, the first sleeve 14*a* of the slider 14 may be directly sleeved on the first rotating shaft 121 and the second rotating shaft 122 for use. Another sliding constraint member does not need to be added to the slider 14, so that the quantity of parts is further reduced, a tolerance chain is also reduced, and a synchronization clearance can be reduced.

Further, the sliding constraint on the slider 14 is disposed in a corner region of the slider 14. As shown in FIG. 7, the slider 14 includes a body part 14*d* that is approximately rectangular, and four first sleeves 14*a* are suspended at both ends on both sides of the body part 14*d*. In this way, distances between sliding constraints in the X\Y direction are as far as possible, to reduce rotation that occurs in conduction synchronous motion when the slider 14 slides in the Y direction, thereby reducing risks of jamming and out-of-synchronization of the first swing arm 111 and the second swing arm 112. It may be understood that only one first sleeve 14*a* or more first sleeves 14*a* may be disposed. In addition, the spiral protruding part 14*b* is disposed on the middle part of the slider 14, that is, between the first sleeves 14*a* at both ends, and the protruding part 14*b* uses space between the two first sleeves 14*a*, so that a size of the slider 14 is not additionally increased, and this helps reduce an overall size of the synchronization mechanism 1. Correspondingly, accommodating space in which the first sleeve 14*a* of the slider 14 slides is disposed on the first swing arm 111 and the second swing arm 112, to ensure that the slider 14 does not interfere with the first swing arm 111 or the second swing arm 112 when the slider 14 moves in the Y direction. Similarly, the spiral grooves 11*b* of the first swing arm 111 and the second swing arm 112 are disposed between upper and lower first sleeves 14*a* of the slider 14. The slider 14, the first swing arm 111, and the second swing arm 112 share space in the axial direction, thereby reducing a size and saving the space.

In this embodiment, the protruding part 14*b* is inserted into the spiral groove 11*b*. Interaction between the protruding part 14*b* and the spiral groove 11*b* is essentially as follows: When the spiral groove 11*b* rotates with the first swing arm 111 and the second swing arm 112, a position, in the Y direction, of a part that is of the spiral groove 11*b* and that is exactly opposite to the protruding part 14*b* changes. Therefore, the groove side wall 11*b*2 of the spiral groove 11*b* pushes the protruding part 14*b*, to drive the slider 14 to move in the Y direction. On the contrary, when the protruding part 14*b* moves in the Y direction, the protruding part 14*b* also pushes the groove side wall 11*b*2 of the spiral groove 11*b*, and the spiral groove 11*b* needs to rotate to adjust to a corresponding position and maintain an insertion relationship with the protruding part 14*b*. Therefore, the spiral groove 11*b* is set to a spiral shape. However, the protruding part 14*b* is not limited to the spiral shape, and may alternatively be a non-spiral structure, for example, a hemispherical shape or a cylindrical shape, provided that the protruding part 14*b* is inserted into the spiral groove 11*b*, and the wall of the protruding part 14*b* in the axial direction can be in contact with a groove side wall of the spiral groove 11*b* and the wall of the protruding part 14*b* in the axial direction and the groove side wall of the spiral groove 11*b* can push each other. Therefore, a width of the protruding part 14*b* in the Y direction needs to be approximately equal to a width of the spiral groove 11*b* in the Y direction, and the width of the protruding part 14*b* may be slightly less than the width of the spiral groove 11*b*. In this way, it is ensured that the protruding part 14*b* and the spiral groove 11*b* can always interact with each other without interfering with relative motion of the protruding part 14*b* and the spiral groove 11*b*.

In addition, it should be noted that a spiral is a continuous structure. In view of a sliding stroke design of the slider 14, in FIG. 5, the spiral groove 11*b* is only a small section of spiral structure, and is projected in the Y direction. A projection of the spiral groove 11*b* may be ring-shaped, or may be arc-shaped, and the protruding part 14*b* is also a small section of spiral structure. Therefore, a spiral trend shown in FIG. 5 is not obvious. Certainly, based on a requirement, a spiral groove 11*b* with a longer continuous length of the spiral may be disposed, and the protruding part 14*b* may also be designed to a longer continuous length of the spiral and a larger surface in contact with the spiral groove 11*b*.

Figure 10:
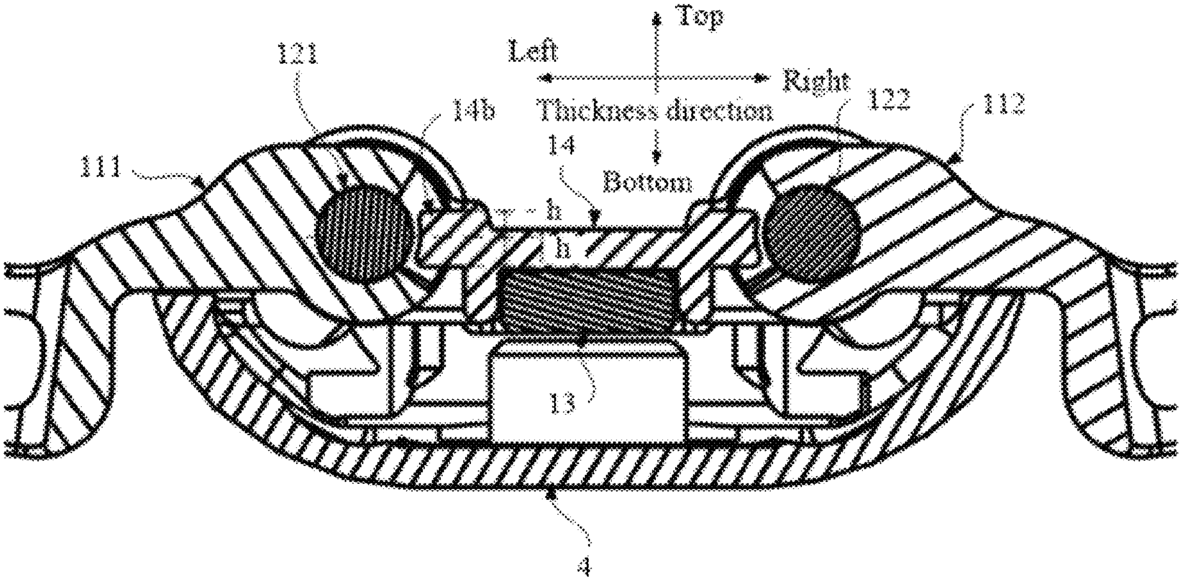
FIG. 10 is an enlarged view of a position of a slider in FIG. 9.

Continue to refer to FIG. 9 and FIG. 10. FIG. 9 is a cross-sectional view of a position of the protruding part 14*b* of the synchronization mechanism 1 in FIG. 1 in the X direction, where the rotating shaft pedestal 3 is not shown. FIG. 10 is an enlarged view of a position of the slider 14 in FIG. 9.

As shown in FIG. 10, the protruding parts 14*b* of the slider 14 are symmetrically disposed with respect to axial lines (that is, axes) of the first rotating shaft 121 and the second rotating shaft 122. In FIG. 10, both a distance between the axes of the first rotating shaft 121 and the second rotating shaft 122 and an end surface of a side that is of the protruding part 14*b* and that faces the flexible foldable screen and a distance between the axes of the first rotating shaft 121 and the second rotating shaft 122 and an end surface on an opposite side are h. To be specific, from a perspective in FIG. 10, a center position of the protruding part 14*b* of the slider 14 in the thickness direction and the axes of the first rotating shaft 121 and the second rotating shaft 122 are at a same height or are on a same horizontal line. The thickness direction is a direction perpendicular to an XY plane. In this way, when the first swing arm 111 or the second swing arm 112 rotates positively and negatively, force applied to the slider 14 is symmetrical and even, so that a risk of jamming of the slider 14 can be reduced, and hand feeling force can be basically symmetrical during positive and negative rotation, to improve user experience. It may be understood that, the foregoing being at the same height does not require entirely equal heights theoretically. When a design requirement is met, there may alternatively be a height derivation between the center position of the protruding part 14*b* in the thickness direction and the axis of the rotating shaft. A deviation range may be 0~0.5 mm, and within the deviation range, it may still be considered as being at a same height.

In addition, as shown in FIG. 7, FIG. 8, and FIG. 10, a surface 14*b*1 that is of the protruding part 14*b* and that faces the spiral groove 11*b* is a spiral curved surface adaptive to the groove bottom surface 11*b*1 of the spiral groove 11*b*. In this way, the protruding part 14*b* can better fit the groove bottom surface 11*b*1 of the spiral groove 11*b*, to better interact with the groove bottom surface 11*b*1 of the spiral groove 11*b*, improve force transmission stability, and correspondingly improve stability in a rotation process of the middle frame 200.

Figure 11:
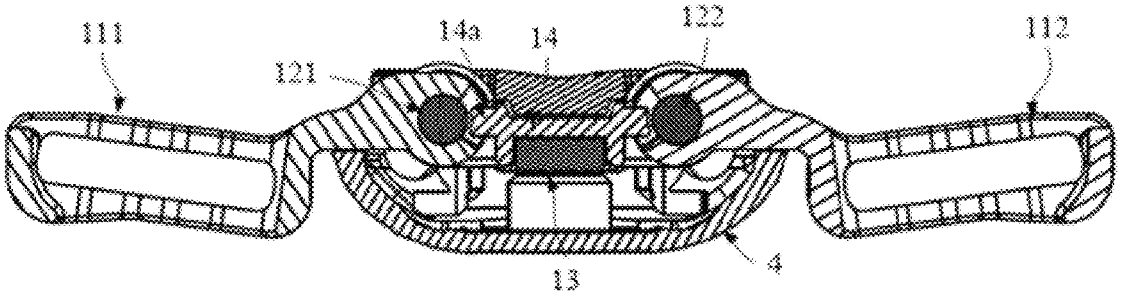
FIG. 11 is a cross-sectional view of a position of a protruding part of a synchronization mechanism in FIG. 1 in an X direction, where a shaft cover is shown.
Figure 12:
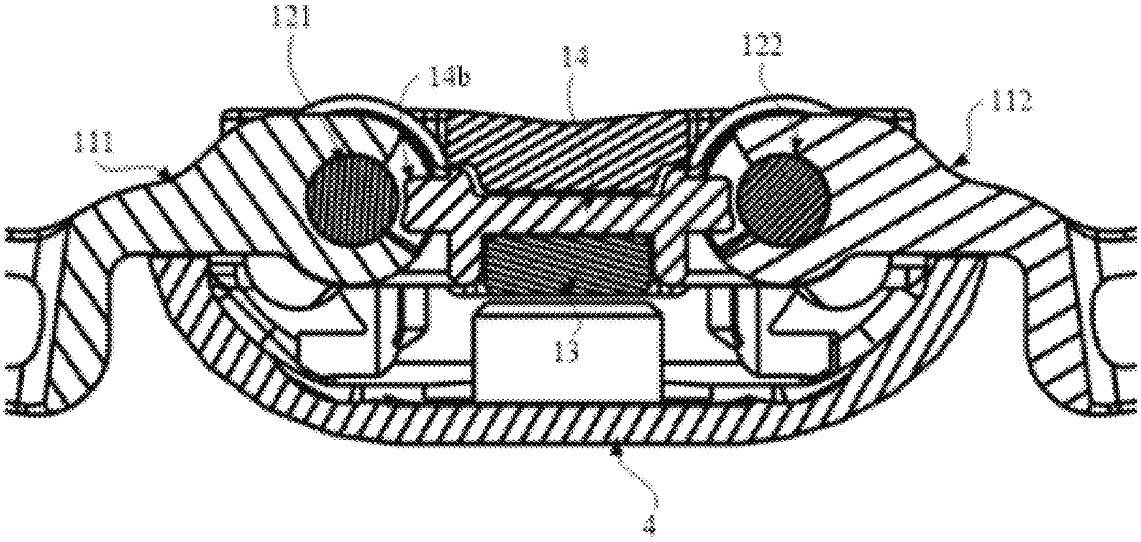
FIG. 12 is an enlarged view of a position of a slider 14 in FIG. 11.
Figure 13:
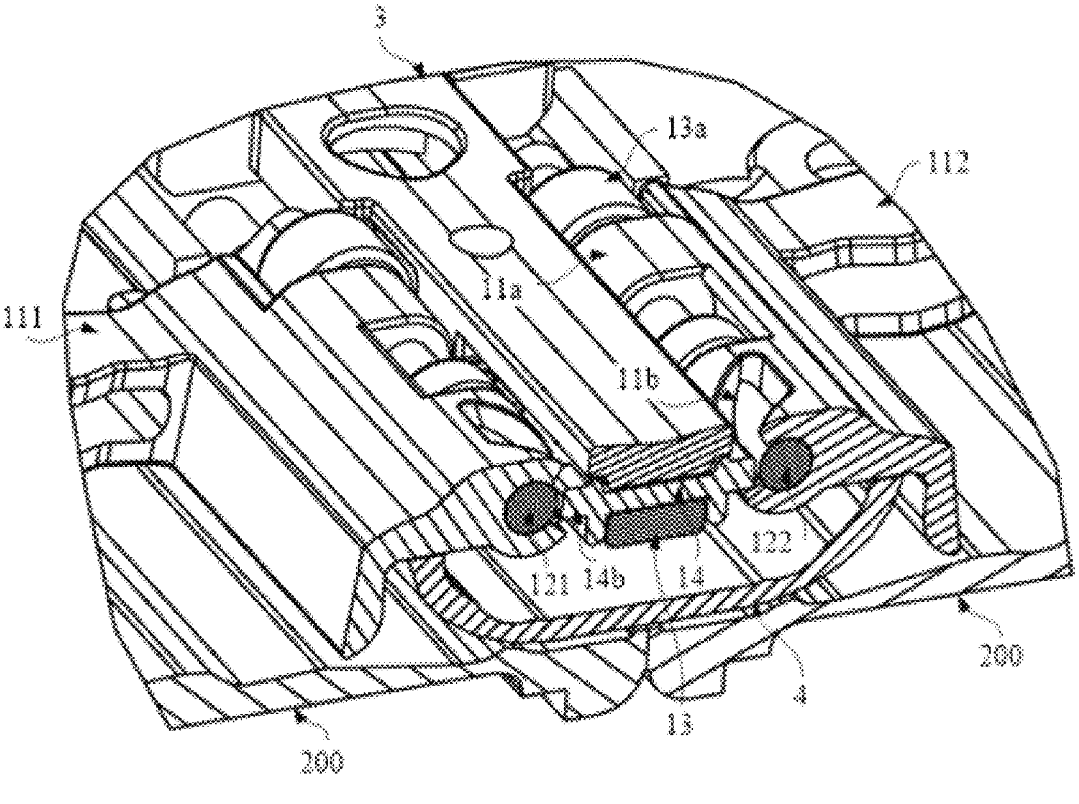
FIG. 13 is a schematic three-dimensional view showing that a synchronization mechanism in FIG. 1 is mounted between a rotating shaft base and a rotating shaft pedestal.

Refer to FIG. 11-FIG. 13. FIG. 11 is a cross-sectional view of a position of the protruding part 14*b* of the synchronization mechanism 1 in FIG. 1 in the X direction, where a shaft cover is shown. FIG. 12 is an enlarged view of a position of the slider 14 in FIG. 11. FIG. 13 is a schematic three-dimensional view showing that the synchronization mechanism 1 in FIG. 1 is mounted between the rotating shaft base 13 and the rotating shaft pedestal 3.

As described above, the mobile phone includes the rotating shaft pedestal 3 supporting the flexible foldable screen, and the slider 14 is disposed between the rotating shaft base 13 and the rotating shaft pedestal 3, and may slide between the rotating shaft base 13 and the rotating shaft pedestal 3, so that space in which the slider 14 slides is inside the rotating shaft mechanism 100, and support of the flexible foldable screen by the rotating shaft pedestal 3 is not affected, to avoid a case in which a hole is caused in the sliding space of the slider 14 and therefore support for the screen deteriorates. In addition, the rotating shaft pedestal 3 separates the flexible foldable screen from the synchronization mechanism 1, to prevent folding from affecting running and synchronization control precision of the synchronization mechanism 1.

It may be understood that the slider 14 is not limited to being disposed between the rotating shaft pedestal 3 and the rotating shaft base 13. For example, the slider 14 may alternatively be disposed between the rotating shaft base 13 and the shaft cover 4. A specific position of the slider 14 may be selected based on factors such as a position of a rotary connection between the first swing arm 111, the second swing arm 112, and the rotating shaft base 13, and a size of space between the shaft cover 4 and the rotating shaft base 13.

The foregoing disposed sliding constraint that the slider 14 slides along the rotating shaft base 13 in the Y direction may be the first sleeve 14*a*, and sleeving of the first sleeve 14*a* on the first rotating shaft 121 and the second rotating shaft 122 implements a constraint in the Y direction. It may be learned that this is not limited thereto. As shown in FIG. 7 and FIG. 13, a groove 14*c* is disposed on a bottom part that is of the slider 14 and that faces the rotating shaft base 13. The rotating shaft base 13 may be inserted into the groove 14*c* in the Y direction. The rotating shaft base 13 may be used as a sliding rail. The slider 14 may directly slide along the rotating shaft base 13. In FIG. 13, a top part of the slider 14 is limited by the rotating shaft pedestal 3. Therefore, the groove 14*c* of the slider 14 is also a sliding constraint that forms sliding relative to the rotating shaft base 13 in the Y direction. In this embodiment, the first sleeves 14*a* disposed on the slider 14 are sleeved on the first rotating shaft 121 and the second rotating shaft 122 to form a sliding constraint. The groove 14*c* is further disposed on the slider 14 to be in slide fit with the rotating shaft base 13 to form another sliding constraint, to ensure an effect of the sliding constraint, and ensure that the slider 14 moves only in the Y direction. It may be learned that if only one of the two sliding constraints is set, movement of the slider 14 relative to the rotating shaft base 13 in the Y direction can also be limited.

Figure 14:
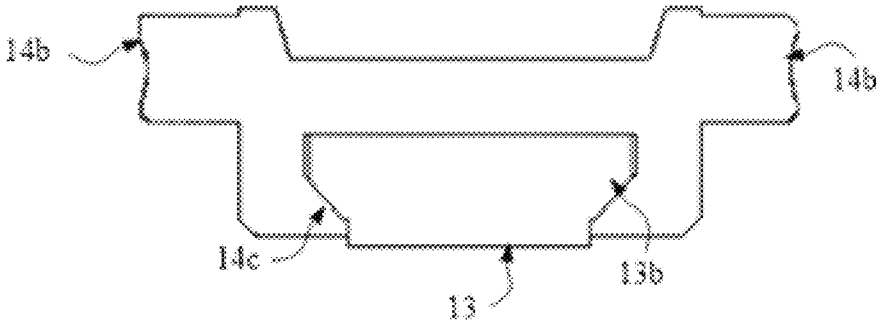
FIG. 14 is a schematic diagram in which a dovetail groove is disposed on a slider to fit a rotating shaft base.

In addition, FIG. 14 is a schematic diagram in which a dovetail groove is disposed on the slider 14 to fit the rotating shaft base 13.

Further, a dovetail groove structure may be disposed between the slider 14 and the rotating shaft base 13, that is, the groove 14*c* disposed on the bottom part of the slider 14 is a dovetail groove, and protrusions 13*b* are correspondingly disposed on left and right sides of the top part of the rotating shaft base 13, to match a shape of the dovetail groove. In this way, a constraint of the slider 14 in the thickness direction in a perspective of FIG. 14 is further added, so that separation of the rotating shaft base 13 from the slider 14 in the direction perpendicular to the XY plane is prevented, a degree of freedom of rotation is further limited, and the sliding constraint is more reliable, to reduce generation of a clearance in a control process of the synchronization mechanism 1, and improve synchronization control precision. Certainly, a specific position, quantity, and the like of the sliding constraint may be adjusted based on an actual product requirement. It may be understood that, a groove is disposed on the rotating shaft base 13, and a sliding platform structure that slides along the chute may be disposed on the slider 14.

In addition, the first rotating shaft 121 and the second rotating shaft 122 of the synchronization mechanism 1 are connected to the rotating shaft base 13. It may be learned that the first rotating shaft 121 and the second rotating shaft 122 may alternatively be directly mounted on the rotating shaft pedestal 3. In practice, the rotating shaft base 13 may not be disposed. This embodiment is mainly to implement sliding of the slider 14 in the Y direction. All the first rotating shaft 121, the second rotating shaft 122, the first swing arm 111, and the second swing arm 112 may be directly disposed on the bottom part of the rotating shaft pedestal 3, or may be disposed on the shaft cover 4. Herein, the rotating shaft base 13 is disposed between the shaft cover 4 and the rotating shaft pedestal 3, so that processing and arrangement are facilitated, and a structure is compact. In addition, the rotating shaft base 13 can support the slider 14, and the slider 14 may be further disposed on the groove 14*c*, so that the slider 14 slides along the rotating shaft base 13, and the slider 14 slides stably.

The foregoing embodiments are mainly described for a foldable-screen mobile phone. It may be learned that the embodiments are not limited to the foldable-screen mobile phone, or another electronic device may be used. The embodiments may not only be applied to an electronic device with a foldable screen, and this solution can be used provided that the electronic device has a requirement for synchronous rotation. For example, the electronic device may be a tablet computer or a notebook computer, or may be a mobile terminal such as a wearable device, a vehicle-mounted device, an augmented reality (augmented reality, AR)/virtual reality (virtual reality, VR) device, an ultra-mobile personal computer (ultra-mobile personal computer, UMPC), a netbook, or a personal digital assistant (personal digital assistant, PDA), or may be a professional shooting device such as a digital camera, a single-lens reflex camera/interchangeable lens digital camera, an action camera, a PTZ camera, or an unmanned aerial vehicle.

The principle and implementations of this application are described herein by using specific examples. The descriptions of the foregoing embodiments are merely used for helping understand the method and core ideas of this application. It should be noted that a person of ordinary skill in the art may make several improvements or modifications without departing from the principle of this application, and the improvements or modifications shall fall within the protection scope of this application.

What is claimed is:

1. A synchronization mechanism, comprising a base, a slider, and a first swing arm and a second swing arm that are located on both sides of the slider, wherein both the first swing arm and the second swing arm are configured to rotate relative to the base;

wherein the slider is slidably disposed in a direction parallel to an axial direction of rotation of the first swing arm and the second swing arm; first fitting parts are symmetrically disposed on both the first swing arm and the second swing arm along a center line of the base, second fitting parts are symmetrically on both sides of the slider along the center line, and the second fitting parts correspond to the first fitting parts; and the synchronization mechanism is configured in a manner that when the first swing arm and the second swing arm rotate relative to each other, the first fitting parts and the second fitting parts fit to drive the slider to slide in the axial direction in a manner that rotation angles of the first swing arm and the second swing arm relative to the base stay consistent;

wherein the synchronization mechanism further comprises a first rotating shaft and a second rotating shaft that are mounted on the base, the first swing arm is configured to rotate around the first rotating shaft, the second swing arm is configured to rotate around the second rotating shaft, and the slider is configured to slide along the first rotating shaft and the second rotating shaft;

wherein first sleeves are disposed on both sides of the slider, the first sleeves on both sides are respectively sleeved on the first rotating shaft and the second rotating shaft, and the slider is configured to slide along the first rotating shaft and the second rotating shaft; and wherein the slider has four corner regions, one of the first sleeves is disposed in each of the four corner regions, and the second fitting part is disposed between two of the first sleeves on each side.

2. The synchronization mechanism according to claim 1, wherein center positions of the second fitting parts on both sides of the slider in a thickness direction are at a same height as axes of the first rotating shaft and the second rotating shaft.

3. The synchronization mechanism according to claim 1, wherein second sleeves are disposed at both ends of each of the first swing arm and the second swing arm, a protrusion is disposed at a middle part in the axial direction, a corresponding one of the first fitting parts is disposed on the protrusion, the first rotating shaft and the second rotating shaft respectively pass through the two corresponding second sleeves and the protrusion, and the corresponding one of the first sleeves is configured to slide between the second sleeve and the protrusion.

4. The synchronization mechanism according to claim 1, wherein each of the first fitting parts is a spiral groove, and each of the second fitting parts is a protruding part.

5. The synchronization mechanism according to claim 4, wherein at least one protruding part is disposed on each side of the slider, and each protruding part corresponds to one spiral groove, or one spiral groove corresponds to more than one protruding part.

6. The synchronization mechanism according to claim 4, wherein a surface that is of the protruding part and that faces the spiral groove is a spiral curved surface that fits a groove bottom surface of the spiral groove.

7. The synchronization mechanism according to claim 4, wherein a width of the protruding part and a width of the spiral groove are equal.

8. The synchronization mechanism according to claim 1, wherein third sleeves are disposed at both ends on both sides of the base, and the first rotating shaft and the second rotating shaft are inserted into two third sleeves on a corresponding side.

9. The synchronization mechanism according to claim 8, wherein the slider is in slide fit with the base in the axial direction.

10. The synchronization mechanism according to claim 9, wherein the slider is disposed between the base and a rotating shaft pedestal, a groove extends in a bottom part of the slider, and the groove is in slide fit with the base; or a groove extends in the base, and a sliding platform that fits the groove is disposed on the bottom part of the slider.

11. The synchronization mechanism according to claim 10, wherein the groove is a dovetail groove, a protrusion is disposed on the base or the slider, and the protrusion is in slide fit with the dovetail groove.

12. A rotating shaft mechanism, wherein the rotating shaft mechanism comprises a rotating shaft pedestal and a shaft cover, at least one group of synchronization mechanisms is disposed between the rotating shaft pedestal and the shaft cover;

wherein each synchronization mechanism comprises a base, a slider, and a first swing arm and a second swing arm that are located on both sides of the slider, and both the first swing arm and the second swing arm are configured to rotate relative to the base, and the slider is slidably disposed in a direction parallel to an axial direction of rotation of the first swing arm and the second swing arm; first fitting parts are symmetrically disposed on both the first swing arm and the second swing arm along a center line of the base, second fitting parts are symmetrically on both sides of the slider along the center line, and the second fitting parts correspond to the first fitting parts;

wherein each synchronization mechanism is configured in a manner that when the first swing arm and the second swing arm rotate relative to each other, the first fitting parts and the second fitting parts fit to drive the slider to slide in the axial direction, in a manner that rotation angles of the first swing arm and the second swing arm relative to the base stay consistent wherein each synchronization mechanism further comprises a first rotating shaft and a second rotating shaft that are mounted on the base, the first swing arm is configured to rotate around the first rotating shaft, the second swing arm is configured to rotate around the second rotating shaft, and the slider is configured to slide along the first rotating shaft and the second rotating shaft;

wherein in each synchronization mechanism, first sleeves are disposed on both sides of the slider, the first sleeves on both sides are respectively sleeved on the first rotating shaft and the second rotating shaft, and the slider is configured to slide along the first rotating shaft and the second rotating shaft; and wherein in each synchronization mechanism, the slider has four corner regions, the first sleeve is disposed in each of the four corner regions, and the second fitting part is disposed between two first sleeves on each side.

13. The rotating shaft mechanism according to claim 12, wherein each base is disposed between the shaft cover and the rotating shaft pedestal of the rotating shaft mechanism.

14. The rotating shaft mechanism according to claim 13, wherein each base is fixedly connected to one of the shaft cover and the rotating shaft pedestal, or each base, the shaft cover, and the rotating shaft pedestal are integrally disposed.

15. An electronic device, wherein the electronic device comprises a flexible foldable screen, a middle frame supporting the flexible foldable screen, and a rotating shaft mechanism;

wherein the rotating shaft mechanism comprises a rotating shaft pedestal and a shaft cover, at least one group of synchronization mechanisms is disposed between the rotating shaft pedestal and the shaft cover;

wherein each synchronization mechanism comprises a base, a slider, and a first swing arm and a second swing arm that are located on both sides of the slider, and both the first swing arm and the second swing arm rotate relative to the base, the slider is slidably disposed in a direction parallel to an axial direction of rotation of the first swing arm and the second swing arm; first fitting parts are symmetrically disposed on both the first swing arm and the second swing arm along a center line of the base, second fitting parts are symmetrically on both sides of the slider along the center line, and the second fitting parts correspond to the first fitting parts; and the synchronization mechanism is configured in a manner that when the first swing arm and the second swing arm are configured to rotate relative to each other, the first fitting parts and the second fitting parts fit to drive the slider to slide in the axial direction, in a manner that rotation angles of the first swing arm and the second swing arm relative to the base stay consistent wherein each synchronization mechanism further comprises a first rotating shaft and a second rotating shaft that are mounted on the base, the first swing arm is configured to rotate around the first rotating shaft, the second swing arm is configured to rotate around the second rotating shaft, and the slider is configured to slide along the first rotating shaft and the second rotating shaft;

wherein in each synchronization mechanism, first sleeves are disposed on both sides of the slider, the first sleeves on both sides are respectively sleeved on the first rotating shaft and the second rotating shaft, and the slider is configured to slide along the first rotating shaft and the second rotating shaft; and wherein in each synchronization mechanism, the slider has four corner regions, the first sleeve is disposed in each of the four corner regions, and the second fitting part is disposed between two first sleeves on each side.

16. The electronic device according to claim 15, wherein the first swing arm or the second swing arm is fastened to the middle frame.

* * * * *